(12) United States Patent
Delpy

(10) Patent No.: US 7,071,782 B2
(45) Date of Patent: Jul. 4, 2006

(54) HF AMPLIFIER WITH SWITCHABLE GAIN

(75) Inventor: Ulrich Delpy, Duisburg (DE)

(73) Assignee: NEC Electronics (Europe) GmbH, Dusseldorf (DE)

(*) Notice: Subject to any disclaimer, the term of this patent is extended or adjusted under 35 U.S.C. 154(b) by 0 days.

(21) Appl. No.: 10/968,523

(22) Filed: Oct. 19, 2004

(65) Prior Publication Data

US 2005/0052242 A1   Mar. 10, 2005

Related U.S. Application Data

(63) Continuation of application No. PCT/EP03/04077, filed on Apr. 17, 2003.

(30) Foreign Application Priority Data

Apr. 22, 2002  (DE) ................. 102 17 867

(51) Int. Cl.
*H03G 3/10* (2006.01)

(52) U.S. Cl. ............ 330/284; 330/144; 330/285; 330/2; 330/296; 330/297; 330/134

(58) Field of Classification Search ........... 330/284, 330/285, 2, 302, 296, 297, 127, 129, 134, 330/138, 144; 327/560, 563, 530, 535

See application file for complete search history.

(56) References Cited

U.S. PATENT DOCUMENTS

| | | | |
|---|---|---|---|
| 3,098,936 A | * | 7/1963 | Isabeau ............... 348/533 |
| 3,883,815 A | * | 5/1975 | Grundy ............... 330/302 |
| 4,028,629 A | | 6/1977 | Ringland |
| 6,211,729 B1 | | 4/2001 | Morkner et al. |
| 6,253,070 B1 | | 6/2001 | Andrews |

FOREIGN PATENT DOCUMENTS

DE   100 34 864 A1   4/2001

OTHER PUBLICATIONS

Millman "Microelectronics Digital and Analog Circuits and Systems" McGraw-Hill Book Company 1979 pp. 68, 69, 530.*

* cited by examiner

*Primary Examiner*—Michael B Shingleton
(74) *Attorney, Agent, or Firm*—Alix, Yale & Ristas, LLP

(57) ABSTRACT

A device for amplifying or attenuating HF signals is characterized in that a transistor is connected in a common-emitter configuration in amplifying operation, and a base-collector diode is connected in the forward-biased direction for attenuating operation.

30 Claims, 5 Drawing Sheets

HF AMPLIFIER WITH SWITCHABLE GAIN

CROSS-REFERENCE TO RELATED APPLICATION

This application is a continuation of International Application No. PCT/EP03/04077 filed on Apr. 17, 2003.

BACKGROUND OF THE INVENTION

The invention concerns high-frequency amplifiers, and more particularly a radio-frequency amplifier which constitutes the input stage of a radio transmission system.

Since the signal levels in radio communication devices are subject to fluctuations of considerable magnitude (several tens of dB), it is necessary to adjust the stages following the input amplifier. Especially in the case of portable radio communication devices (e.g. mobile telephones), requirements concerning cost minimization and miniaturization are also important. This demands a simple circuit implementation. In order to accommodate this simple circuit implementation, a reduction in gain by a fixed amount suffices for certain applications. However, it is necessary in this context to ensure that the linearity of the amplifier does not change significantly, especially in the case of high input levels when the overall gain is to be reduced.

Known amplifiers with gain control either work with switchable passive attenuating elements or use electronically controlled attenuating elements (e.g. PIN diodes). In these three-layer diodes, the HF resistance can be controlled by means of a DC current in the forward direction.

SUMMARY OF THE INVENTION

The object of the present invention is to permit the necessary adjustment in gain inexpensively by means of a simple circuit implementation.

This is accomplished by a method and a device for amplifying or attenuating HF signals as a function of a DC configuration of a bipolar transistor. The transistor is operated in a common-emitter configuration in the amplifying operation. The base-collector diode is operated in the forward bias direction in an attenuating operation. A NPN bipolar transistor or a PNP bipolar transistor is employed. The HF signals contain a band of HF signals. A bipolar or a unipolar DC supply is employed. The operating states are switched by means of switching transistors or switching diodes. The base-emitter diode is unbiased or is connected in the blocking direction in an attenuating operation. The circuit arrangement may be asymmetrical or symmetrical. A variable resistor sets the current through the base-collector diode.

BRIEF DESCRIPTION OF THE DRAWINGS

The invention is described in detail with reference to the attached drawings, where.

DETAILED DESCRIPTION OF THE PREFERRED EMBODIMENTS

Figure 1:
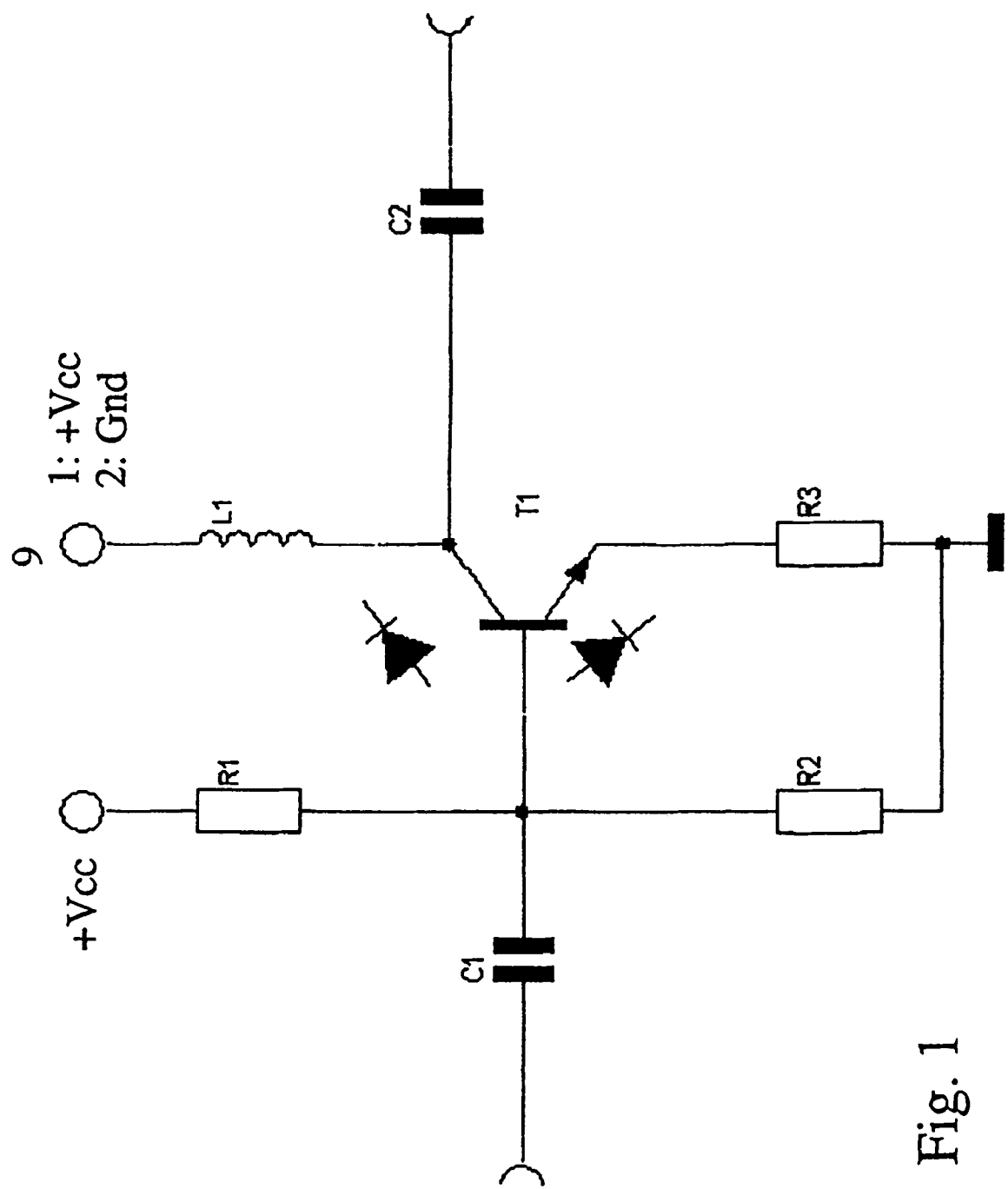
FIG. 1 shows a circuit diagram of a circuit arrangement of the present invention.

In accordance with the invention, a circuit arrangement is created which uses the provision of DC voltages to permit switchable gain or attenuation of an HF signal. The circuit arrangement contains a bipolar transistor as an HF active element for both operating states. The transistor is wired in a common-emitter configuration. A distinction can be made between the two possible operating states; reference is made to FIG. 1 for the purpose of explanation. The matching elements needed in HF amplification for a good input/output reflection coefficient, maximum gain, and minimum noise amplification are known to the practitioner of the art, so they have been omitted from the figures for reasons of clarity.

Only the DC supply for the transistor is required to illustrate the inventive concept. In addition to the transistor, the diodes are also shown in order to indicate the polarity of the respective internal transistor diodes. The transistor is embodied in a conventional manner in a normal grounded-emitter circuit. In this exemplary embodiment with positive supply voltage, it is an NPN transistor; the opposite polarity with a PNP transistor would also be possible with a negative supply voltage. For amplifying operation 1, the connection 9 is connected to the positive supply voltage +Vcc and the impedance R3 is low-resistance; in contrast, for attenuating operation 2, the connection 9 is grounded and the impedance R3 is high-resistance. In the first case, the base voltage divider ensures that the base-emitter diode is operated in the forward-biased direction, and at this established operating point the transistor amplifies HF signals present at the base by way of the DC decoupling capacitor. The collector is connected to Vcc through an inductor L1 so as to be able to couple the amplified HF signal out through C2.

Figure 2:
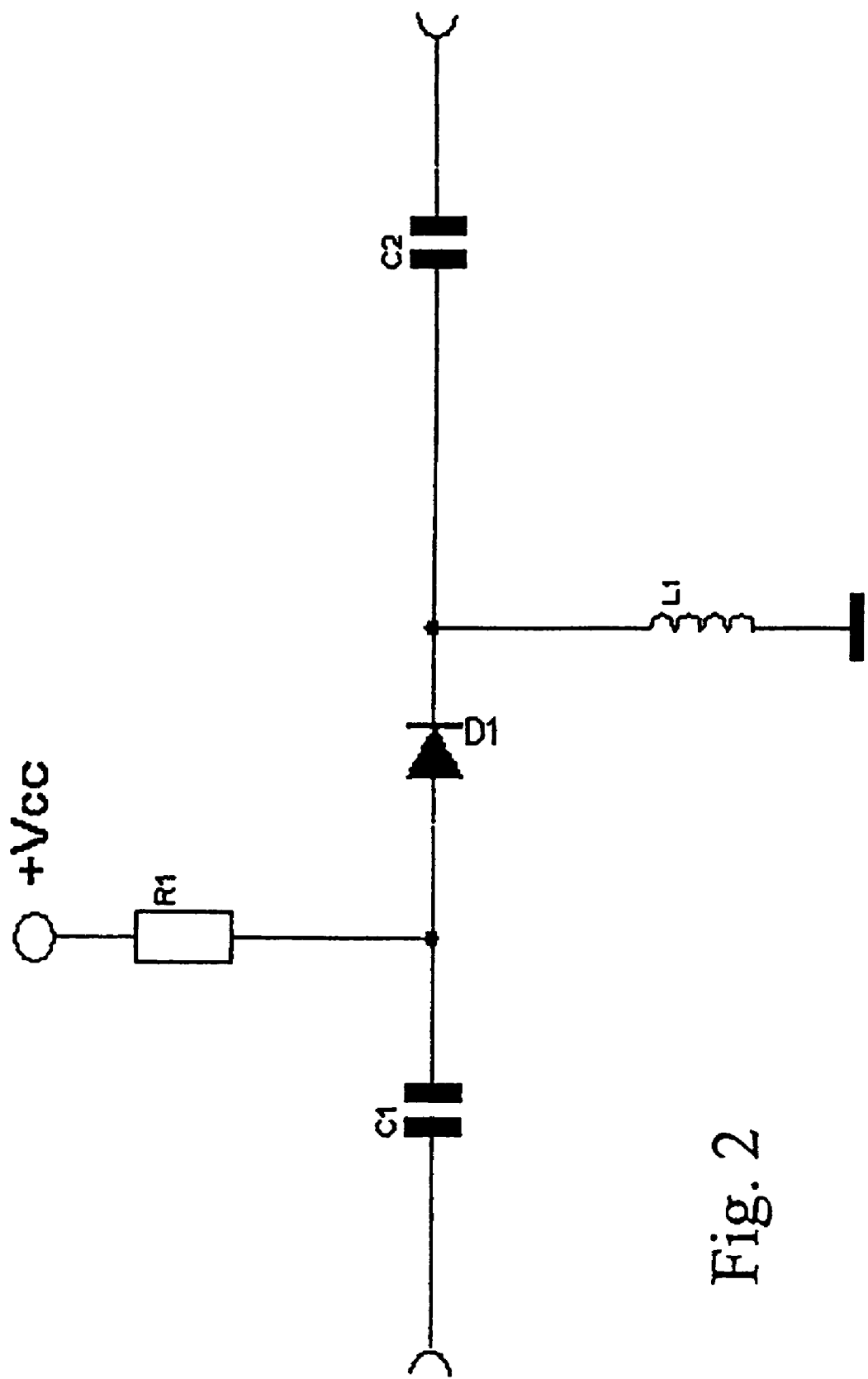
FIG. 2 shows an equivalent circuit diagram to FIG. 1 for attenuating operation.

To operate the amplifier as an attenuating element, the base-collector diode is wired in the forward-biased direction, for example by connecting the collector branch to ground. In this configuration, only the base-collector diode is active and wired in the forward-biased direction. It acts as an HF attenuating element as a function of the current, set by R1, which flows through the diode. FIG. 2 shows the equivalent circuit resulting from this DC configuration.

Figure 3:
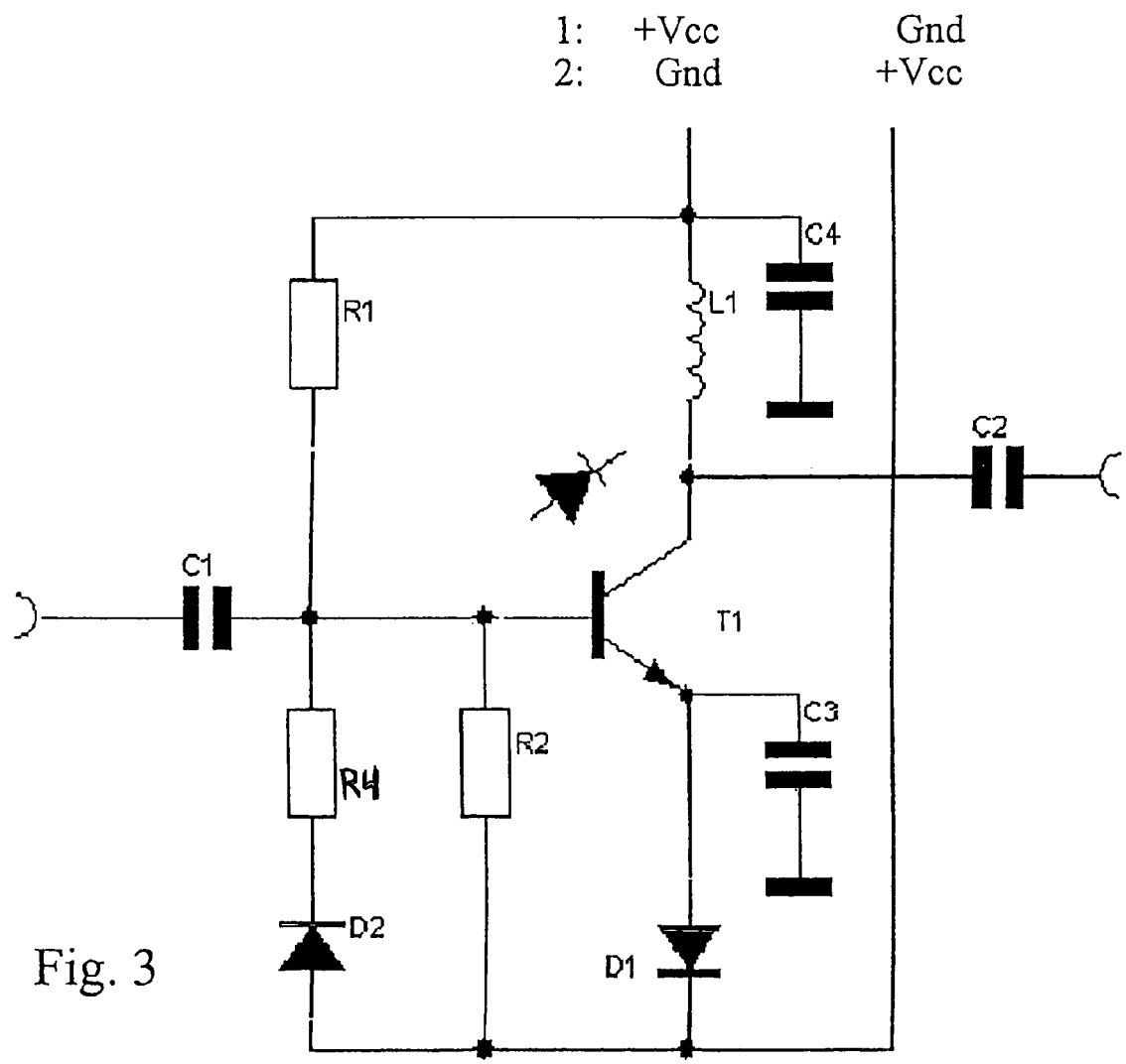
FIG. 3 shows a circuit diagram of another exemplary embodiment of the present invention.
Figure 4:
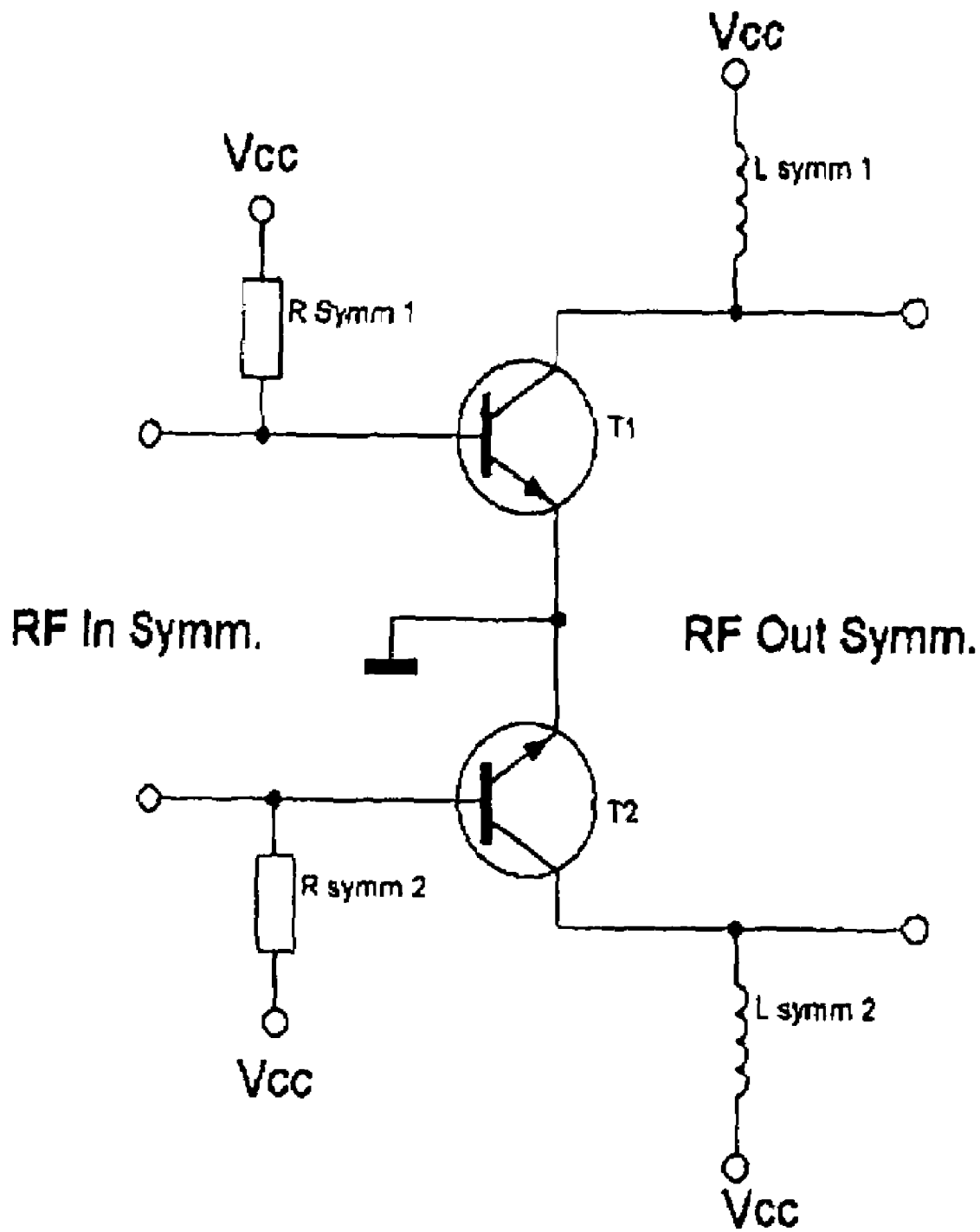
FIG. 4 shows a circuit diagram of another exemplary embodiment of the present invention employing switching transistors to change the operating state of the circuit.
Figure 5:
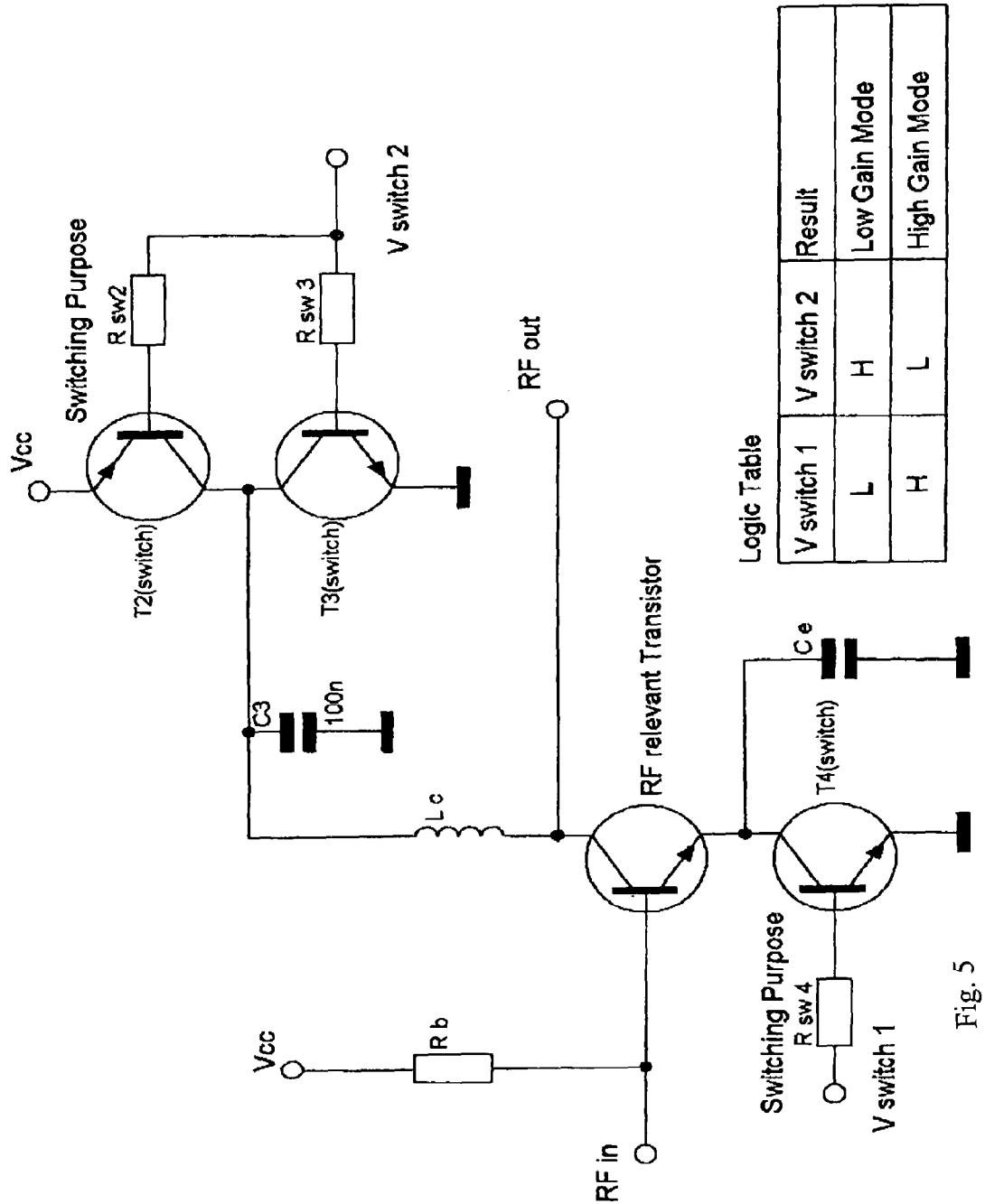
FIG. 5 shows a circuit diagram of another exemplary embodiment of the present invention employing a symmetrical circuit configuration.

FIG. 3 shows an additional exemplary embodiment. In this case, the switchover is accomplished by reversing the polarity of the supply voltage. To switch the states required for this operation, two diodes (D1, D2) are used. The HF characteristics of the circuit are achieved by the reversal of the operating voltage of the transistor. In amplifying operation 1, D1 conducts and D2 blocks. In this way, the transistor is provided with an appropriate bias voltage by the voltage divider R1, R2 and a collector current is set. In attenuating operation 2, D1 blocks and D2 conducts. In this case, the bias voltage is connected such that the base-collector diode conducts and acts as an HF resistance. Only the transistor is the HF active component in this circuit. The diodes perform only the DC switchover. Further exemplary embodiments, for example using switching transistors as shown in FIG. 5, are conceivable and to be viewed as variants. Moreover, the circuit arrangement can also be implemented symmetrically, for example using two transistors as shown in FIG. 4.

What is claimed:

1. A method of amplifying or attenuating HF signals comprising:
   configuring an NPN bipolar transistor having a base, a collector, an emitter, a base-collector junction and a base-emitter junction in a common emitter configuration including a switchable voltage source connected to the collector;
   providing a base voltage at said base;
   amplifying HF signals applied to said base by applying a first voltage to said collector through said switchable voltage source, said first voltage selected to reverse bias said base-collector junction and to forward bias said base-emitter junction; and attenuating HF signals applied to said base by applying a second voltage to said collector through said switchable voltage source, said second voltage selected to forward bias said base-collector junction, said second voltage being applied to said collector while said base voltage is maintained at its original level or varied to control forward bias of said base-collector junction, wherein the varied base voltage level is equal to or more positive than the emitter level and more positive than the collector level.

2. The method of claim 1, the HF signals contain a band of HF signals.

3. The method of claim 1, further comprising a bipolar DC supply.

4. The method of claim 1, further comprising a unipolar DC supply.

5. The method of claim 1, wherein the operating states are switched by means of switching transistors.

6. The method of claim 1, wherein the operating states are switched by means of switching diodes.

7. A circuit for amplifying or attenuating HF signals comprising:
   an NPN bipolar transistor having a base, a collector, an emitter, a base-collector junction and a base-emitter junction, said NPN bipolar transistor arranged in a common emitter configuration, and a selected base voltage applied to the base;
   a switchable voltage source arranged to apply either a first voltage or a second voltage to said collector, said first voltage selected to reverse bias said base-collector junction and forward bias said base-emitter junction, and said second voltage selected to forward bias said base-collector junction;
   said circuit being operable to amplify HF signals applied to said base wherein said switchable voltage source is switched to apply said first voltage to said collector; and
   said circuit being operable to attenuate HF signals applied to said base wherein said switchable voltage source is switched to apply said second voltage to said collector while said base voltage is maintained at its original level or varied to control forward bias of said base-collector junction, wherein the varied base voltage level is equal to or more positive than the emitter level and more positive than the collector level.

8. The method of claim 1, wherein the base-emitter diode is connected in the blocking direction in attenuating operation.

9. The method of claim 1, wherein the bipolar transistor is connected in an asymmetrical circuit.

10. The method of claim 1, wherein the bipolar transistor is connected in a symmetrical circuit.

11. The method of claim 1, wherein said attenuating comprises setting the current through the base-collector diode using a variable resistor.

12. The circuit of claim 7, wherein the HF signals contain a band of HF signals.

13. The circuit of claim 7, further comprising a bipolar DC supply.

14. The circuit of claim 7, further comprising a unipolar DC supply.

15. The circuit of claim 7, comprising switching transistors for switching the operating states.

16. The circuit of claim 7, characterized by switching diodes for switching the operating states.

17. The circuit of claim 7, wherein the base-emitter diode is connected in the blocking direction in attenuating operation.

18. The circuit of claim 7, wherein the circuit arrangement is asymmetrical.

19. The circuit of claim 7, characterized in that the circuit arrangement is symmetrical.

20. The circuit of claim 9, wherein said attenuating comprises setting the current through the base-collector diode using a variable resistor.

21. The method according to claim 1, comprising:
    controlling the degree of attenuation in attenuating operation as a function of the current which flows through said base-collector junction.

22. The method according to claim 1, comprising:
    restricting current flow through the base-emitter junction during attenuating operation.

23. A method of amplifying or attenuating HF signals comprising:
    configuring an PNP bipolar transistor having a base, a collector, an emitter, a base-collector junction and a base-emitter junction in a common emitter configuration including a switchable voltage source connected to the collector;
    providing a base voltage at said base;
    amplifying HF signals applied to said base by applying a first voltage to said collector through said switchable voltage source, said first voltage selected to reverse bias said base-collector junction and forward bias said base-emitter junction; and
    attenuating HF signals applied to said base by applying a second voltage to said collector through said switchable voltage source, said second voltage selected to forward bias said base-collector junction, said second voltage being applied to said collector while said base voltage is maintained at its original level or varied to control forward bias of said base-collector junction, wherein the varied base voltage level is equal to or more negative than the emitter level and more negative than the collector level.

24. The method according to claim 23, comprising:
    controlling the degree of attenuation in attenuating operation as a function of the current which flows through said base-collector junction.

25. The method according to claim 23, comprising:
    restricting current flow through the base-emitter junction during attenuating operation.

26. The circuit of claim 7, comprising:
    means for restricting current flow through said base-emitter junction during operation in said attenuation mode.

27. The circuit of clam 7, wherein the degree of HF signal attenuation is a function of current flow through said forward biased base-collector junction.

28. A circuit for amplifying or attenuating HF signals comprising:

an PNP bipolar transistor having a base, a collector, an emitter, a base-collector junction and a base-emitter junction, said PNP bipolar transistor arranged in a common emitter configuration, and a selected base voltage applied to the base;

a switchable voltage source arranged to apply either a first voltage or a second voltage to said collector, said first voltage selected to reverse bias said base-collector junction and forward bias said base-emitter junction, and said second voltage selected to forward bias said base-collector junction;

said circuit being operable to amplify HF signals applied to said base wherein said switchable voltage source is switched to apply said first voltage to said collector; and said circuit being operable to attenuate HF signals applied to said base wherein said switchable voltage source is switched to apply said second voltage to said collector while said base voltage is maintained at its original level or varied to control forward bias of said base-collector junction, wherein the varied base voltage level is equal to or more negative than the emitter level and more negative than the collector level.

29. The circuit of claim 28, comprising:

means for restricting current flow through said base-emitter junction during operation in said attenuation mode.

30. The circuit of clam 28, wherein the degree of HF signal attenuation is a function of current flow through said forward biased base-collector junction.

* * * * *